United States Patent [19]

Sakaguchi et al.

[11] Patent Number: 4,755,314
[45] Date of Patent: Jul. 5, 1988

[54] SINGLE CRYSTAL WAFER OF LITHIUM TANTALATE

[75] Inventors: Susumu Sakaguchi, Kanagawa; Masaaki Iguchi, Gunma, both of Japan

[73] Assignee: Shin-Etsu Chemical Co., Ltd., Chiyoda, Japan

[21] Appl. No.: 804,188

[22] Filed: Dec. 3, 1985

[30] Foreign Application Priority Data

Dec. 4, 1984 [JP] Japan ................... 59-256291

[51] Int. Cl.$^4$ ............. C01G 35/00; C30B 15/00; H01L 41/22
[52] U.S. Cl. ................... 252/62.9; 156/617.1; 156/DIG. 65; 156/DIG. 87; 310/360
[58] Field of Search ........... 156/DIG. 71, DIG. 87, 156/617 SP, DIG. 65; 252/62.9; 310/313 A, 313 R, 360

[56] References Cited

U.S. PATENT DOCUMENTS

| | | | |
|---|---|---|---|
| 3,525,885 | 8/1970 | Ballman et al. | 310/360 |
| 3,955,109 | 5/1976 | Comparini et al. | 310/360 |
| 4,245,200 | 1/1981 | Takahashi et al. | 310/360 |

OTHER PUBLICATIONS

Hirano, H, *LiTaO$_3$ Crystals for Commercial SAW TV IF Filters*, Ferroelectrics, vol. 27, pp. 151-156, 1980.
Rudd, D. et al., *Growth of Lithium Tantalate Crystals for Transmission Resonator and Filter Devices*, Solid State Tech., Jan. 1974, p. 52-55.

Primary Examiner—John Doll
Assistant Examiner—R. Bruce Breneman
Attorney, Agent, or Firm—Hopgood, Calimafde, Kalil, Blaustein & Judlowe

[57] ABSTRACT

The x-cut single crystal wafer of lithium tantalate according to the invention is characterized by the orientation flat formed in a specific crystallographic orientation. The plane of the orientation flat should be (A) in parallel with the (018) plane or a plane which is in parallel with the x-axis and makes an angle of 15° or smaller with the (018) plane or (B) in parallel with a plane which is in parallel with the x-axis and perpendicular to the (018) plane or a plane which is in parallel with the x-axis and makes an angle of 15° or smaller with the plane which is in parallel with the x-axis and perpendicular to the (018) plane. In contrast to conventional lithium tantalate single crystal wafers provided with an orientation flat in a direction parallel to the 112° Y direction, the location of the crystallographic orientation of the orientation flat is very easy and consequently great advantages are obtained in the working efficiency of locating the direction of the orientation flat and improved quality as well as increased yield of acceptable devices, e.g. SAW filters, prepared from the wafers.

2 Claims, 1 Drawing Sheet

FIGURE
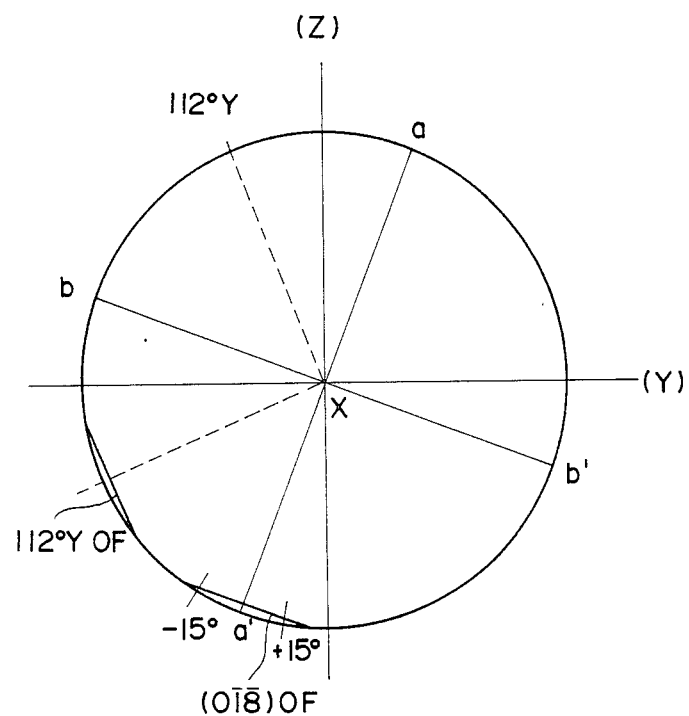

SINGLE CRYSTAL WAFER OF LITHIUM TANTALATE

BACKGROUND OF THE INVENTION

The present invention relates to a single crystal wafer of lithium tantalate or, more particularly, to a single crystal wafer of lithium tantalate provided with an orientation flat having at a specific crystallographic orientation.

As a material having a high electromechanical coupling coefficient and small temperature dependency of various parameters as the inherent characteristics, single crystals of lithium tantalate are widely used as a promising material for various kinds of SAW devices such as resonators in VCR instruments, PIF filters in televisions sets and the like as well as other devices useful in high frequency communication instruments.

As is known, single crystal boules of lithium tantalate are usually grown by the so-called Czochralski method from a melt of an oxide mixture having a composition of $LiTaO_3$ by pulling up a boule on a seed in the direction of x-axis. The single crystal boule thus grown is first subjected to a poling treatment to align the ferroelectric domains into a single domain and then sliced perpendicularly to the x-axis into socalled x-cut wafers from which various devices are manufactured.

It is a usual practice that the x-cut wafer of a lithium tantalate single crystal is provided with an orientation flat, i.e. a flat lateral surface formed by grinding in a specified crystallographic orientation to facilitate subsequent works of fabrication into devices. In the x-cut single crystal wafers of lithium tantalate, the orientation flat is formed usually by grinding the lateral surface parallel to the 112° Y direction located by the back-reflection Laue method or other suitable method in view of the easiness in distinguishing the direction of the propagation of ultrasonic surface acoustic waves in the preparation of devices. In other words, the orientation of the orientation flat is at the 112° Y direction which should be the desired propagating direction of the ultrasonic surface acoustic waves.

A problem in forming the orientation flat in such an orientation is that, due to the absence of any crystalline lattice plane in this direction effective for the diffraction of X-rays, it is necessary that the single crystal is positioned at the correct direction by use of a holding jig of the crystal or by fine adjustment of the crystal direction by the back-reflection Laue method so that, even by setting aside the poor efficiency in the positioning works, the accuracy in the direction of the crystalline orientation is unavoidably low, consequently resulting in the poor performance or low quality of the devices prepared from the single crystal wafers or in the low yield of acceptable devices prepared therefrom.

SUMMARY OF THE INVENTION

An object of the present invention is therefore to provide a single crystal wafer of lithium tantalate free from the above mentioned problems and disadvantages in connection with the crystallographic orientation of the orientation flat formed on the wafer.

More particularly, the object of the invention is to provide an x-cut single crystal wafer of lithium tantalate having an orientation flat, which is freed from the difficulties in the exact location of the direction and the disadvantages due to the low accuracy in the crystallographic orientation of the orientation flat as is the case when the orientation flat is formed at a direction of 112° Y of the wafer in the prior art such as the poor performance and low quality of the devices prepared therefrom and low yield of acceptable devices.

Thus, the x-cut single crystal wafer of lithium tantalate according to the invention is a wafer having at least one orientation flat, the plane thereof being (A) in parallel with a crystallographic (018) plane or a plane which is in parallel with the x-axis and makes an angle of 15° or smaller with the (018) plane; or (B) in parallel with a plane which is in parallel with the x-axis and perpendicular to the (018) plane or a plane which is in parallel with the x-axis and makes an angle of 15° or smaller with the plane which is in parallel with the x-axis and perpendicular to the (018) plane.

BRIEF DESCRIPTION OF THE DRAWING

The FIGURE is a stereo projection in an orientation perpendicular to the x-axis of the lithium tantalate single crystal for the explanation of the crystallographic orientation of the orientation flat on an x-cut single crystal wafer of lithium tantalate.

DETAILED DESCRIPTION OF THE PREFERRED EMBODIMENTS

In the following, the inventive single crystal wafer of lithium tantalate is described in detail with reference to the accompanying drawing.

In the FIGURE of the drawing, the direction of the x-axis of the single crystal is naturally perpendicular to the plane of the paper since the wafer is an x-cut wafer while the directions of the y- and z-axes are given by the transverse and vertical directions, respectively, as is shown in the FIGURE by (Y) and (Z), respectively. The line a–a' shows the plane perpendicular to the (018) plane while the line b–b' shows the plane in parallel with the (018) plane of the single crystal. The plane of the orientation flat should be (A) in parallel with the (018) plane, i.e. perpendicular to the line a–a' in the FIGURE, or (B) in parallel with the plane which is in parallel with the x-axis and perpendicular to the (018) plane, i.e. perpendicular to the line b–b' in the FIGURE. It is, however, not necessary that the plane of the orientation flat exactly satisfy the above mentioned orientation but a deviation of ±15° is tolerable from the above mentioned crystallographic orientations (A) and (B). Namely, the plane of orientation can be in parallel with a plane which is in parallel with the x-axis and perpendicular to either one of the above mentioned planes (A) and (B). Although the range of ±15° is shown on both sides of the point given by a' only, a similar range can be given also on both sides of each of the points shown by a, b and b'. The broken lines in the FIGURE show the 112° Y direction and the direction perpendicular thereto and conventional x-cut single crystal wafers of lithium tantalate are provided with an orientation flat in parallel to the 112° Y direction as is indicated by 112° Y OF in the FIGURE.

Since the (018) plane of an x-cut single crystal wafer of lithium tantalate is a direction of the crystalline lattice plane responsible to or effective in the diffraction of X-rays, the (018) plane can be located easily in a short time with high accuracy by the method of X-ray diffractometry. Accordingly, the orientation flat, indicated by (0$\overline{1}$8) OF in the FIGURE, can be formed with a high accuracy of the direction. The plane of the orientation flat is not necessarily in exact parallism with the (018) plane but substantially the same advantages are obtained when the plane of the orientation flat is in such a crystallographic orientation that the plane is in parallel with a plane which is parallel with the x-axis and makes an angle of 15° or smaller with the (018) plane. Therefore, great advantages are obtained when the single crystal wafer is processed into SAW devices and the like in respect of the performance and quality of the devices as well as the yield of acceptable devices in addition to the advantage of decreased difficulties in the location of the direction of the orientation flat in comparison with the conventional wafers provided with an orientation flat in the 112° Y direction contributing to the improved working efficiency.

The broadness or width of the orientation flat is, of course, not particularly limitative and should be determined in accordance with the diameter of the single crystal wafer, specific order of the users and other parameters like in conventional single crystal wafers. The method for forming the orientation flat is also not limitative and can be conventional including grinding, shaving, cutting and the like.

In the following, an example of the x-cut single crystal wafer of lithium tantalate according to the invention is described in more detail.

EXAMPLE

A single crystal boule of lithium tantalate having a diameter of about 80 mm and a length of about 100 mm as grown in the direction of x-axis was subjected to a poling treatment for conversion into a single domain and the lattice plane of (018) thereof was determined using a cut-surface inspection instrument. The accuracy of the direction was usually within ±30″.

The single crystal boule was then shaped into a cylindrical form of 76.2 mm diameter on a cylindrical grinder and provided by grinding with an orientation flat of 22 mm width in the crystallographic orientation in parallel with the (018) plane. The thus shaped cylindrical single crystal rod was sliced into wafers each having a thickness of 0.500 mm in a plane perpendicular to the x-axis. The wafers were subjected to the inspection of the direction of the orientation flats to give a result that the deviation of the orientation of the orientation flats on the wafers was within only ±30″ to be much smaller than the corresponding value of ±0.5° in the conventional wafers provided with an orientation flat in the 112° Y direction located by the X-ray Laue method.

When the single crystal wafers were used for the preparation of SAW devices with the aid of the orientation flat, the deviation of the resonating frequency was extremely small from the calculated value to ensure greatly improved quality and performance of the devices in addition to the advantage in the greatly increased yield of the acceptable devices.

What is claimed is:

1. An x-cut single crystal wafer of lithium tantalate which is a wafer having at least one orientation flat, the plane thereof being:
(A) in parallel with a crystallographic (018) plane or a plane which is in parallel with the x-axis and makes an angle of 15° or smaller with the (018) plane; or
(B) in parallel with a plane which is in parallel with the x-axis and perpendicular to the (018) plane or a plane which is in parallel with the x-axis and makes an angle of 15° or smaller with the plane which is in parallel with the x-axis and perpendicular to the (018) plane.

2. A method of preparing a single crystal wafer of lithium tantalate having at least one orientation flat, comprising the steps of:
(a) forming a boule of lithium tantalate crystal grown in the direction of a selected x-axis;
(b) aligning plural ferroelectric domains within said boule into a single domain;
(c) locating an 018 crystallographic plane within said boule and substantially parallel to said x-axis;
(d) forming an orientation flat on said boule, the plane thereof being:
 (i) in parallel with said 018 crystallographic plane or a plane which is parallel to the x-axis and makes an angle of 15 degrees or smaller with the 018 plane; or
 (ii) in parallel with a plane which is in parallel with the x-axis and perpendicular to the 018 plane or a plane which is in parallel with the x-axis and makes an angle of 15 degrees or smaller with the plane which is in parallel with the x-axis and perpendicular to the 018 plane; and
(e) forming x-cut wafers from said boule.

* * * * *